(12) United States Patent
Damadian

(10) Patent No.: US 7,102,353 B1
(45) Date of Patent: Sep. 5, 2006

(54) MAGNETIC RESONANCE IMAGING APPARATUS HAVING MOVING MAGNETS

(75) Inventor: Raymond V. Damadian, Woodbury, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 11/170,899

(22) Filed: Jun. 30, 2005

Related U.S. Application Data

(63) Continuation-in-part of application No. 10/725,155, filed on Dec. 1, 2003.

(60) Provisional application No. 60/429,973, filed on Nov. 29, 2002.

(51) Int. Cl.
*G01V 3/00* (2006.01)

(52) U.S. Cl. .................................... 324/318

(58) Field of Classification Search ................. 324/318
See application file for complete search history.

(56) References Cited

U.S. PATENT DOCUMENTS

| 4,924,198 A | 5/1990 | Laskaris |
| 4,985,678 A | 1/1991 | Gangarosa et al. |
| 5,008,624 A | 4/1991 | Yoshida |
| 5,065,761 A | 11/1991 | Pell |
| 5,153,546 A | 10/1992 | Laskaris |
| 5,305,365 A | 4/1994 | Coe |
| 5,436,607 A | 7/1995 | Chari et al. |
| 6,011,396 A | 1/2000 | Eckels et al. |
| 6,414,490 B1 | 7/2002 | Damadian et al. |
| 6,677,753 B1 | 1/2004 | Danby et al. |

*Primary Examiner*—Diego Gutierrez
*Assistant Examiner*—Megann E. Vaughn
(74) *Attorney, Agent, or Firm*—Lerner, David, Littenberg, Krumholz & Mentlik, LLP

(57) ABSTRACT

An apparatus and method for magnetic resonance imaging comprising a magnet and means for vertically moving the magnet so as to obtain an image of a portion of a patient's anatomy.

21 Claims, 7 Drawing Sheets

MAGNETIC RESONANCE IMAGING APPARATUS HAVING MOVING MAGNETS

CROSS-REFERENCE TO RELATED APPLICATIONS

The present application is a continuation-in-part of U.S. application Ser. No. 10/725,155, filed on Dec. 1, 2003, which claims the benefit of the filing date of U.S. Provisional Application No. 60/429,973, filed on Nov. 29, 2002, the disclosures of which are hereby incorporated herein by reference.

BACKGROUND OF THE INVENTION

The present invention relates to magnetic resonance imaging apparatus and procedures. In magnetic resonance imaging, an object to be imaged as, for example, a body of a human subject is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the precessing atomic nuclei to rotate or "precess" in phase and in an excited state. As the precessing atomic nuclei relax, weak radio frequency signals are emitted; such radio frequency signals are referred to herein as magnetic resonance signals.

Different tissues produce different signal characteristics. Furthermore, relaxation times are the dominant factor in determining signal strength. In addition, tissues having a high density of certain nuclei will produce stronger signals than tissues having a low density of such nuclei. Relatively small gradients in the magnetic field are superimposed on the static magnetic field at various times during the process so that magnetic resonance signals from different portions of the patient's body differ in phase and/or frequency. If the process is repeated numerous times using different combinations of gradients, the signals from the various repetitions together provide enough information to form a map of signal characteristics versus location within the body. Such a map can be reconstructed by conventional techniques well known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Several factors impose significant physical constraints in the positioning of patients and ancillary equipment in MRI imaging. Many MRI systems use solenoidal superconducting coils to provide a static magnetic field. The coils are arranged so that the patient is disposed within a small tube running through the center of the coils. The coil and tube typically extend along a horizontal axis, so that the long axis or head-to-toe axis of the patient's body must be in a horizontal position during the procedure. Moreover, equipment of this type provides a claustrophobic environment for the patient.

Iron core magnets have been built to provide a more open environment for the patient. These magnets typically have a ferromagnetic frame with a pair of ferromagnetic poles disposed one over the other along a vertical pole axis with a gap between them for receiving the patient. The frame includes ferromagnetic flux return members such as plates or columns which are located outside the patient-receiving area and extend vertically. A magnetic field is provided by permanent magnets or electromagnetic coils (superconductive or resistive) associated with the frame. A magnet of this type can be designed to provide a more open environment for the patient. However, it is still generally required for the patient to lie with his or her long axis horizontal.

Recently, ferromagnetic frame magnets having horizontal pole axes have been developed. As disclosed, for example, in commonly assigned U.S. Pat. Nos. 6,414,490 and 6,677,753, the disclosures of which are incorporated by reference herein, a magnet having poles spaced apart from one another along a horizontal axis provides a horizontally oriented magnetic field within a patient-receiving gap between the poles. Such a magnet can be used with a patient positioning device including elevation and tilt mechanisms to provide extraordinary versatility in patient positioning. For example, where the patient positioning device includes a bed or similar device for supporting the patient in a supine or recumbent position, the bed can be tilted and/or elevated so as to image the patient in essentially any position between a fully standing position and a fully recumbent position, and can be elevated so that essentially any portion of the patient's anatomy is disposed within the gap in an optimum position for imaging. As further disclosed in the aforesaid applications, the patient positioning device may include additional elements such as a platform projecting from the bed to support the patient when the bed is tilted upright for a standing or sitting orientation. Still other patient supporting devices can be used in place of a bed in a system of this type. Thus, magnets of this type provide extraordinary versatility in imaging.

FIG. 1 of the current application shows a sectional view of an MRI magnet subsystem 100. MRI magnet subsystem 100 includes a magnet having a ferromagnetic frame 102, a flux generating means as is described in further detail below, and a patient handling system 106. The ferromagnetic frame 102 includes a first side wall 108 and a second side wall. For purposes of clarity, FIG. 1 does not show the second side wall or any of its associated structures. The side walls extend vertically. The ferromagnetic frame 102 also includes a top flux return structure 112 and a bottom flux return structure 114. The top flux return structure 112 may include two columns 116 and 118. Between these two columns, a top opening 120 is defined. Similarly, the bottom flux return structure 114 may include two columns 122 and 124 that together define a bottom opening 126. Thus, the side walls and flux return structures 112 and 114 form a rectilinear structure, with the top flux return structure 112 constituting the top wall of the rectilinear structure, the bottom flux return structure 114 constituting the bottom wall of the rectilinear structure and the side walls forming the side walls of the rectilinear structure. The frame 102 of the rectilinear structure defines a front patient opening 128 on one side of the frame 102 and a similar back patient opening 130 on the opposite side of the frame 102. The ferromagnetic frame 102 further includes a first magnetic pole 132 and a second magnetic pole. The first magnetic pole 132 extends from the first side wall 108 towards the second side wall and the second magnetic pole extends from the second side wall towards the first side wall 108. The magnetic poles are generally cylindrical and are coaxial with one another on a common horizontal polar axis 136. Between the magnetic poles is a gap 131, also referred to as the patient-receiving space, of the magnet. The gap or patient-receiving space 131 is accessible by the front patient opening 128, the back patient opening 130, the top opening 120 or the bottom opening 126.

The flux generating means includes a first electromagnetic coil assembly 138 which surrounds the first magnetic pole 132, and a second electromagnet coil assembly, which surrounds the second magnetic pole in a like fashion. These electromagnetic coil assemblies may be either resistive or superconductive.

The patient handling system 106 is capable of three degrees or axes of motion. The patient handling system 106 may be termed an upright patient handling system, although the patient handling system 106 is not limited to standing position applications and may include sitting and other upright positions, as well as the recumbent position. The patient handling system 106 includes a carriage 142 mounted on rails 144. The carriage 142 may move linearly back and forth along the rails 144. The rails 144 typically do not block the bottom open space 126. A patient handling system operative in the manner described herein is disclosed in U.S. application Ser. No. 09/918,369, filed on Jul. 30, 2001, which is entitled "Positioning System For An MRI," the disclosure of which is incorporated by reference herein.

A generally horizontal pivot axis 146 is mounted on carriage 142. An elevator frame 148 is mounted to the pivot axis 146. The carriage 142 is operable to rotate the elevator frame 148 about the pivot axis 146. A patient support 150 is mounted on the elevator frame 148. The patient support 150 may be moved linearly along the elevator frame 148 by an actuator 152. Thus, a patient 154 can be positioned with a total of three degrees of freedom, or along three axes of movement or motion. Specifically, the patient handling system 106 can move a patient 154 in two linear directions and also rotate the patient 154 around an axis. The arrows 155 of FIG. 1 show the three axes of movement possible with the patient handling system 106. Note that often the rails 108 are mounted such that portions of patient 154 may be positioned below the rails through bottom open space 126.

Often, a foot rest 158 may be used in order to support a patient in a standing position. Given the wide variety of positions possible with the patient handling system 108, many other such supports may be implemented, such as chair seats or straps.

The patient handling system 106 incorporates one or more actuators 152 and an actuation control unit 153. Actuators 152 may be conventional electrical, electromechanical, pneumatic, hydraulic or other devices capable of imparting the desired motion to the elements of the patient handling system. For example, the actuators may include elements such as conventional stepper motors or other conventional electric motors linked to the elements of the patient handling system 106. The actuator control unit 153 may incorporate a conventional programmable controller, microprocessor, or computer with appropriate input and output interfaces. As further discussed below, the actuation control unit 153 is linked to a control computer and to the manual controls which regulate the patient handling system. The actuation control unit may be mounted in proximity to the actuators 152 as, for example, on carriage 142.

The MRI magnet subsystem 100 with patient handling system can be contrasted with an older MRI system such as shown in FIG. 2A. The MRI apparatus 200 has a magnet canopy 202 and a bed 204 on which the patient 206 lies recumbent. The bed 204 is typically capable only of linear motion to the left and right in the orientation of FIG. 2B. This linear motion is restricted to a horizontal plane inside the magnet bore. Thus, many of the advantages of the patient handling system as discussed in the aforementioned applications are unavailable. A control panel 208 with simple controls 210 may be mounted directly to the magnetic canopy 202. Alternatively, the control panel 208 may be mounted directly to the bed 204.

In addition to apparatus for magnetic resonance imaging described above, U.S. Pat. No. 5,008,624 to Yoshida ("Yoshida") discloses a magnet having a pair of super conductor blocks one facing each other placed at two ends of a metallic U-shaped frame. Yoshida's magnet further includes a patient carrier in the form of a chair equipped with a lifting mechanism and a reclining mechanism. Yoshida further discloses that by rotating the U-Shaped frame of the magnet or by lifting up and down the patient carrier with lifting mechanism, various relative orientations of the main magnet and the patient carrier are realizable.

SUMMARY

In accordance with an aspect of the present invention, an apparatus for magnetic resonance imaging is provided. The apparatus preferably comprises a magnet having a gap for receiving a patient and means for moving the magnet in a substantially vertical direction so that a portion of a region of interest of a patient positioned within the gap can be imaged.

In accordance with this aspect of the present invention, the magnet preferably comprises a superconducting solenoidal magnet. The magnet may also comprise a U-shaped magnet.

Further in accordance with this aspect of the present invention, the apparatus further desirably comprises a patient support positioned within the gap for supporting the patient.

Further in accordance with this aspect of the present invention, the means for moving the magnet preferably comprises one or more motors that are connected to one or more jacks for lowering or raising the magnet. Most preferably, the jacks are screw jacks. The one or more motors may desirably comprise either electric motors, electromechanical devices, or pneumatic devices that are capable of imparting the desired motion to the magnet.

An additional aspect of the present invention is an apparatus for magnetic resonance imaging comprising a magnet having a patient receiving space and a pair of vertical support members connected to the magnet at opposite ends of the magnet. One or more motors are desirably coupled to at least one of the vertical support members so as to move the magnet in a substantially vertical direction.

In accordance with this aspect of the present invention, it is desirable that the magnet comprise a solenoidal magnet. It may also prove desirable if the solenoidal magnet comprises a superconducting solenoidal magnet.

Further in accordance with this aspect of the present invention, it is preferable that the one or more motors comprise at least one electrical device, at least one electromechanical device, or at least one pneumatic device capable of imparting the desired motion to the vertical support member. It may also prove desirable if the one or more motors comprise at least one hydraulic device capable of imparting the desired motion to the vertical support members.

In accordance with an additional aspect of the present invention, a method for magnetic resonance imaging is provided. The method preferably comprises establishing a static magnetic field in a magnet gap and positioning a patient within a patient receiving space. The method further comprises positioning the static magnetic field so as to envelop a portion of a patient's anatomy and applying a gradient field to the static magnetic field so as to obtain a magnetic resonance image of the patient's anatomy.

Further in accordance with the method aspect of the present invention, positioning the static magnetic field comprises raising or lowering the magnet so that the magnet gap envelops a portion of the patient's anatomy.

It may also prove desirable to position the patient on a patient support prior to placing the patient and positioning patient support in the patient receiving space.

In accordance with a further aspect of the present invention, an apparatus for magnetic resonance imaging is provided. The apparatus preferably comprises first and second superconducting solenoidal coils that are arranged to provide a static horizontal magnetic field. The first and second superconducting solenoidal coils are respectively connected to first and second support members, at least one of which is connected to at least one motor. The at least one motor is used to translate the first and second superconducting solenoidal coils in a substantially vertical direction. The apparatus thereby advantageously allows for magnetic resonance imaging of various areas of interest on a patient's anatomy.

Further in accordance with this aspect of the present invention, the first and second support members desirably comprise first and second structures oriented so as to maintain translation of said first and second superconducting coils in the substantially vertical direction. Further still, the first and second vertical support members may comprise first and second vertical support members and respective support brackets.

Further in accordance with this aspect of the present invention, the first and second vertical support members preferably each comprise screw jacks that are each coupled to a first motor and a second motor from among the at least one motor. The motors may desirably comprise electric motors, electromechanical devices or pneumatic devices that are capable of imparting the desired motion to the first and second superconducting coils.

An additional aspect of the present invention is a magnetic resonance imaging system preferably comprising a magnet having a frame and a pair of poles that define a patient receiving space; a structure having a top and a bottom for housing said magnet such that said magnet is desirably integrated into the structure; and an elevator mounted beneath the bottom of the structure and operable translate the magnet in or substantially vertical direction.

Further in accordance with this aspect of the present invention, the structure preferably comprises a room and the top comprises a ceiling and the bottom comprises a floor of said room. Most preferably, the ceiling and floor each include openings through which vertical runs of the frame of the magnet is mounted so as to allow vertical translation.

Further in accordance with this aspect of the present invention, the room is preferably shielded to limit the area of a fringe field produced by said magnet.

Further still in accordance with this aspect of the present invention, the system may further desirably include a patient support positioned within the patient receiving space, the patient support being capable of supporting a patient in a standing, sitting or recumbent position.

DETAILED DESCRIPTION

Figure 1:
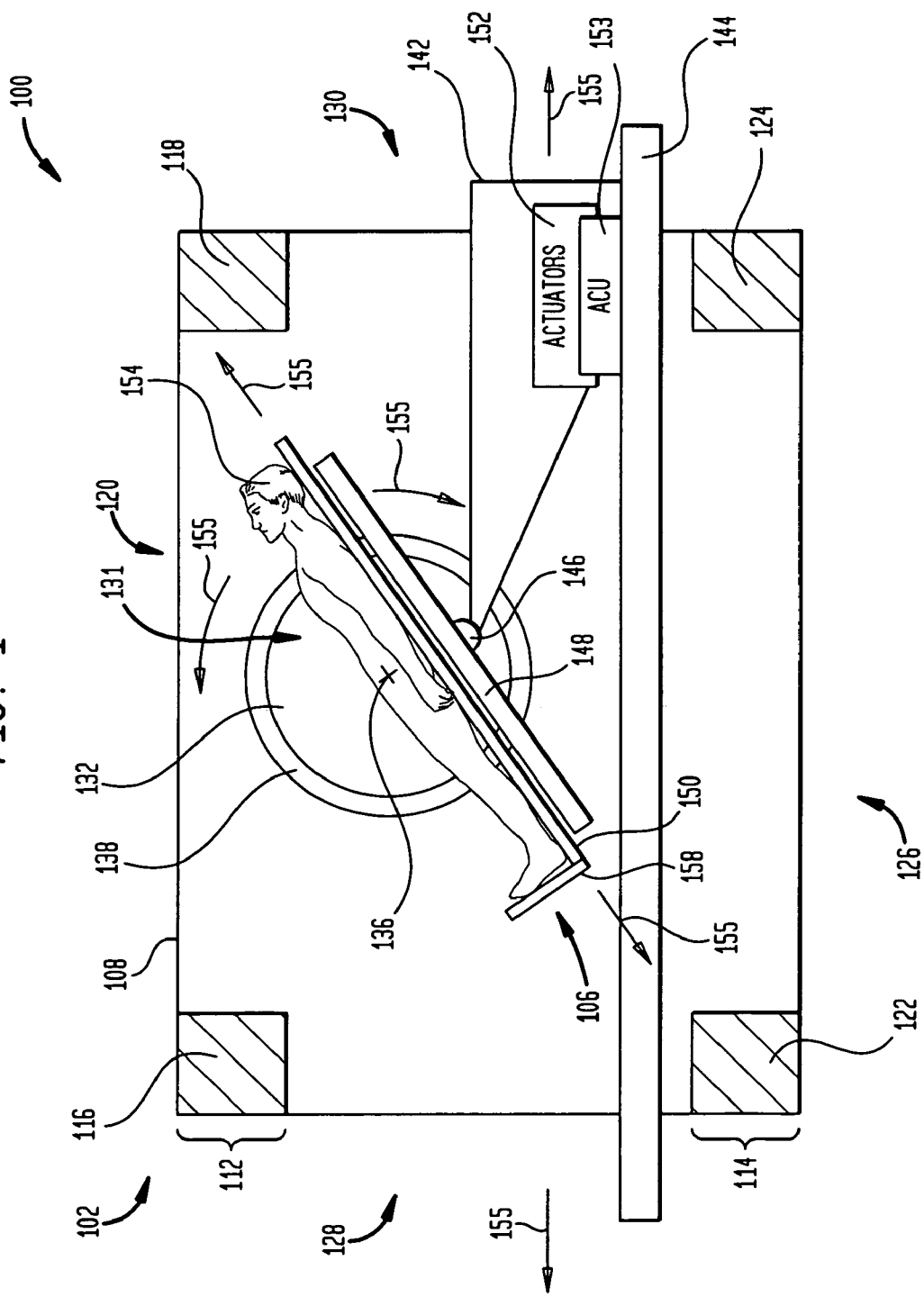
FIG. 1 is a diagrammatic sectional view of a MRI main subsystem with a stand-up patient handling system with certain portions removed for clarity of illustration.
Figure 2A:
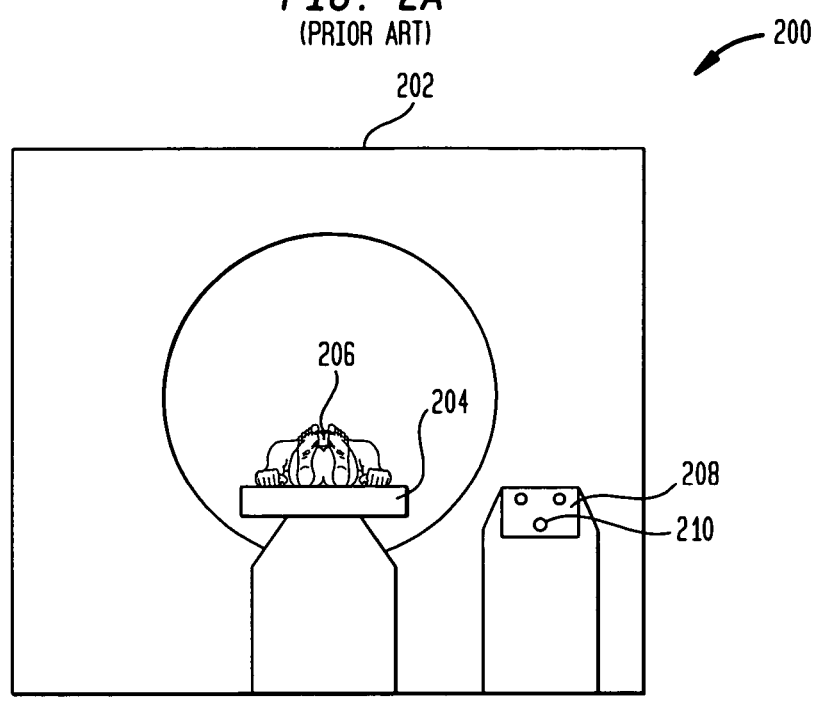
FIGS. 2A and 2B are diagrammatic frontal and side elevation views of an older MRI apparatus.
Figure 2B:
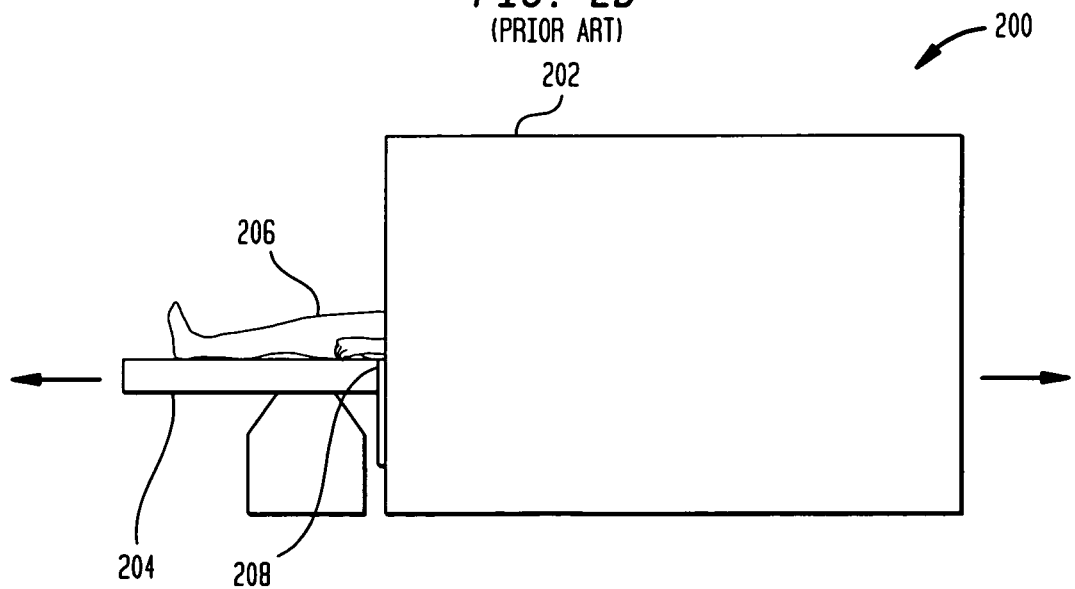
Figure 3:
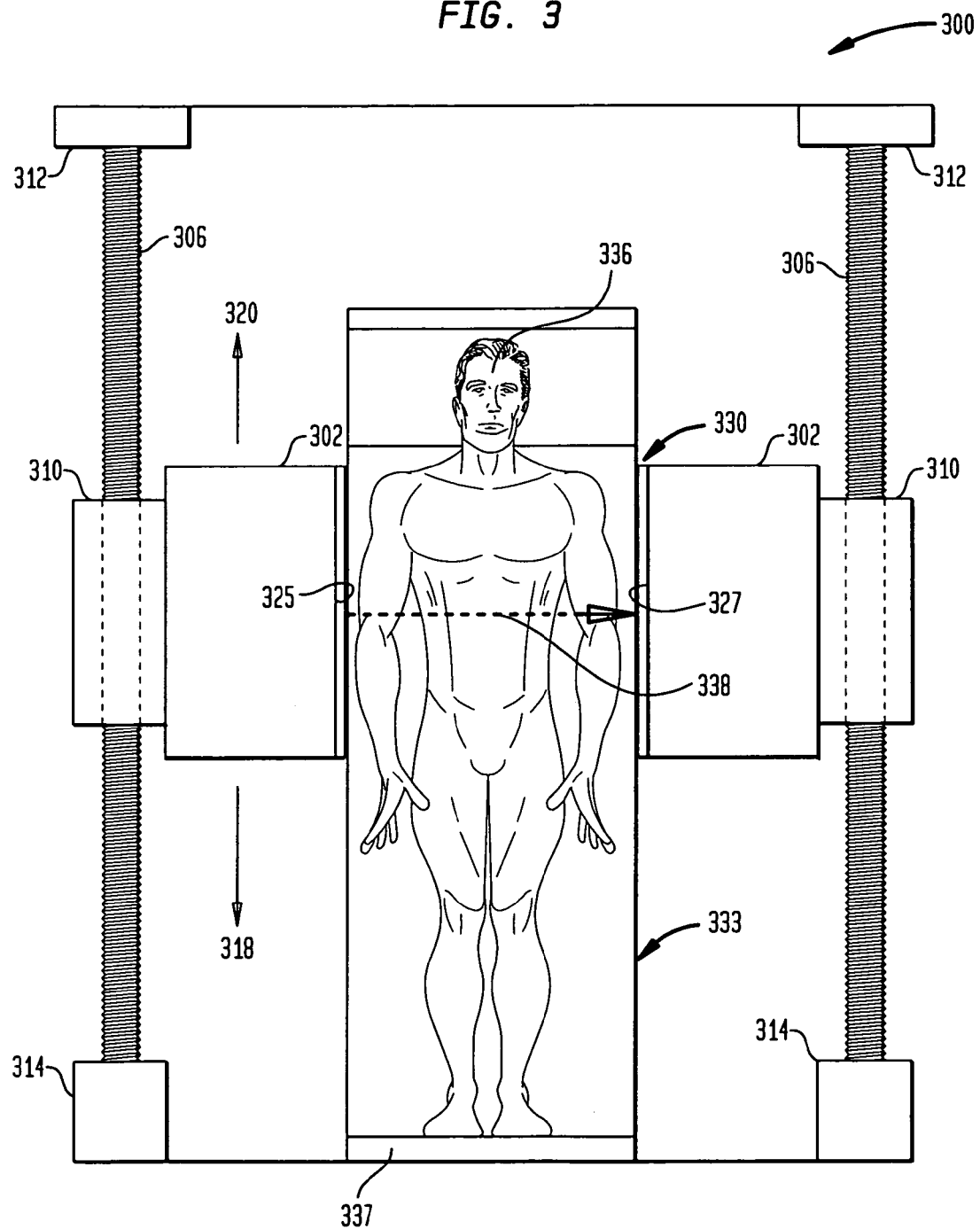
FIG. 3 is a schematic of a front view of an MRI apparatus in accordance with an embodiment of the present invention.

FIG. 3 shows a schematic front view of a magnetic resonance imaging apparatus 300 in accordance with an aspect of the present invention. Magnetic resonance imaging apparatus 300 comprises a U-shaped magnet 302 that is movably mounted to a pair of screw jacks or shafts 306 by mounting sleeve 310. At one end of the screw jacks 306 is a support structure 312. At the other end of the screw jacks 306 are motors 314.

Motors 314 may comprise electrical, electromechanical, pneumatic, hydraulic or other devices capable of imparting the desired motion to the screw jacks 306. In particular, the motor 314 causes the screw jacks 306 to rotate clockwise or counterclockwise to lower 318 or raise 320 the magnet 302 so that scanning may be performed of a region of interest of the patient's anatomy. The motor 314 itself may further include controls, not shown, that an operator may use to lower or raise the patient.

The magnet 302 further includes a pair of pole faces 325 and 327 that define a patient receiving space or gap 330. A patient support 333 may be positioned within the gap 330. Alternatively, a patient may stand within the gap 330 without the aid of a patient support. Preferably, prior to positioning a patient 336 within the gap 330, a static magnetic field 338 is created across the pole faces 325 and 327 (in a horizontal direction). Most preferably, the static magnetic field is maintained even when a patient is not positioned in the gap. Alternatively, once the patient 336 is positioned within the gap 330, either by using the support 333 or by standing, the static magnet field may be created across the gap 330. Relatively small magnetic field gradients may then be imposed on the static magnetic field to obtain images of the anatomical region of interest as described hereinabove. The patient support 336 preferably includes a step or foot support 337 for supporting the patient 336 in the standing position. A seat may also be provided for supporting the patient in a sitting position. Patient support 336 may also optionally include straps or other suitable restraints to restrict or control the movement of the patient during scanning.

In accordance with an aspect of the present invention, the motors 314 may be positioned far enough away from the magnetic field so as to avoid having to be shielded. Alternatively, the motors may be shielded to avoid being affected by the magnetic field or vice versa.

In operation, a patient 336 is positioned on the patient support 333. The magnet 302 is then suitably lowered or raised by activation of the motors 314. In particular, the motor 314 once activated causes the screw jack 306 to rotate which in turn causes the mounting sleeves to elevate or lower, depending on the direction of rotation, which in turn raises or lowers the magnet 302. In this way, various anatomical areas of interest of the patient 336 may be scanned, including but not limited to the torso, head, ankles or feet of the patient 336.

Figure 4:
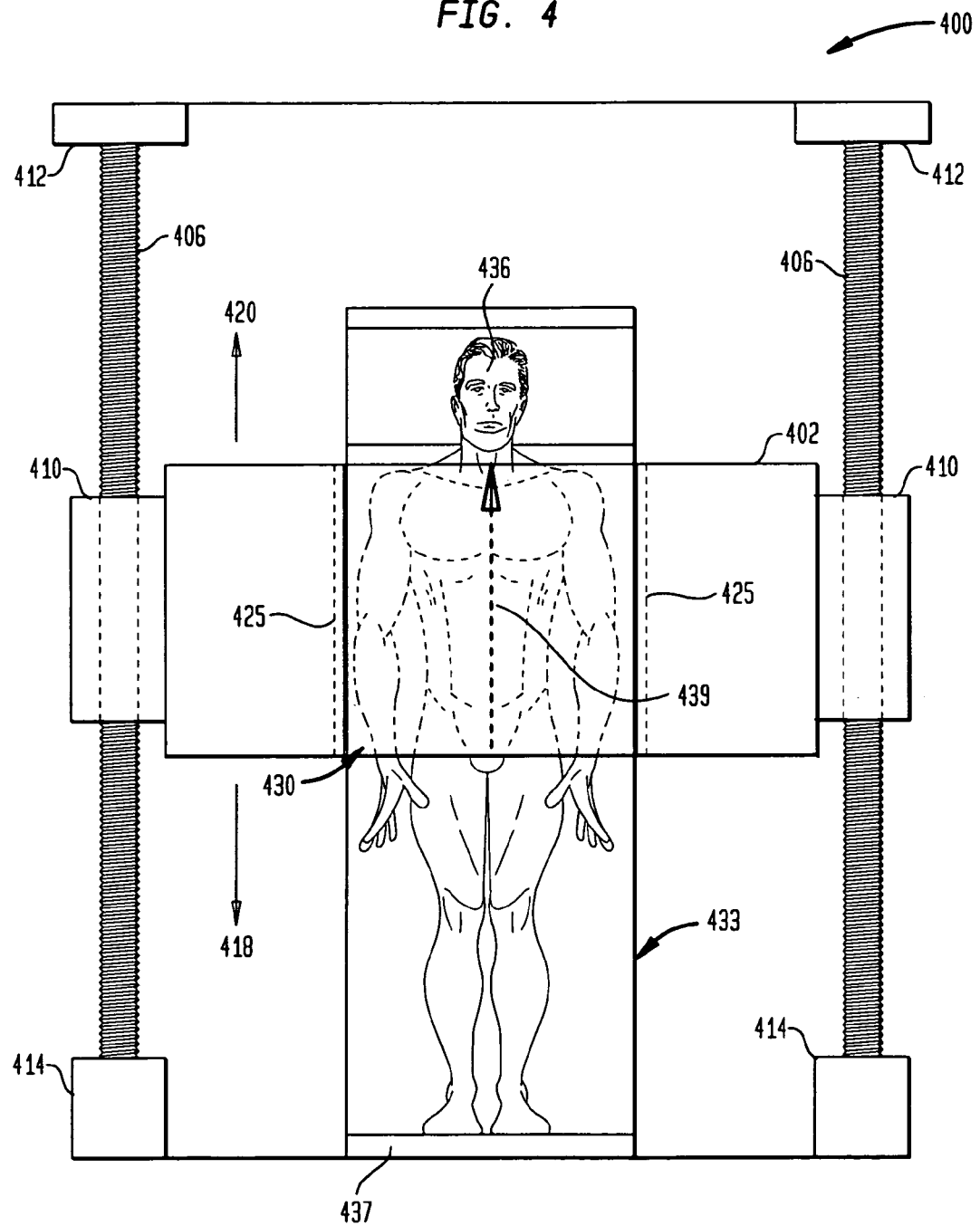
FIG. 4 is a schematic of a front view of an MRI apparatus in accordance with an embodiment of the present invention.

FIG. 4 shows a schematic front view of a magnetic resonance imaging apparatus 400 in accordance with another aspect of the present invention. Magnetic resonance imaging apparatus 400 comprises a superconducting solenoidal magnet 402 that is movably mounted to a pair of screw jacks or shafts 406 by mounting sleeve 410. At one end of the screw jacks 406 is a support structure 412. At the other end of the screws jack 406 are motors 414.

Motors 414 may comprise electrical, electromechanical, pneumatic, hydraulic or other devices capable of imparting the desired motion to the screw jacks. In particular, the motor 414 causes the screw jacks 406 to rotate clockwise or counterclockwise to raise 420 or lower 418 the magnet 402 so that scanning may be performed of the region of interest on the patient's anatomy. The motor itself may further include controls that an operator uses to lower or raise the patient accordingly. As previously discussed, the motors 414 may be shielded or placed outside the reach of the magnetic field to allow for reliable operation of the motors and imaging system.

The magnet 402 comprises a tubular solenoid having an interior bore 425, the magnet being arranged to provide the required magnetic field in a working volume within the bore 425. A patient 436 can be positioned within the bore 425 so that the part of the patient's body to be imaged is disposed within the working volume. A patient support 433 capable of supporting the patient 436 may be also provided. Nonetheless, it is possible to have the patient stand without the aid of a patient support and perform the imaging procedure. However, to reduce patient movement and enhance throughput a support of some form of support, including a chair, is preferable. Where a support is used the interior bore 425 should be large enough to define a patient receiving space or gap 430 large enough to accept both the support 433 and the patient 436. The patient support 436 preferably includes a step 437 for supporting the patient 436 in the standing position, however, as previously noted, a seat may be provided for supporting the patient in a sitting position. Patient support 436 may also optionally include straps or other suitable restraints to restrict or control the movement of the patient during scanning.

Once a patient 436 is properly positioned within the patient gap 430 a static magnet field 439 is caused to occur across the gap 430. Relatively small magnetic field gradients may then be imposed on the static magnetic field to obtain images of the anatomical region of interest as described hereinabove. Preferably, the static magnetic field is always on to avoid having to re-energize the coils of the magnet each time a patient is to be scanned. However, it may prove preferable to leave the magnet on in lieu of turning it on each time a patient is about to be scanned. Accordingly, the coils will preferably be energized at the start of the day and left on until the end of the day.

In operation, a patient 436 is positioned on the patient support 433 while the magnet is raised 420 to a height that allows the patient to be initially positioned on the support 433. Once this initial positioning is complete the magnet 420 is then lowered or raised so that the imaging volume surrounds that portion of the patient's anatomy of interest, as shown for example in FIG. 4. An operator may thereafter lower or raise the magnet 402 to better position the patient within the gap 430 as needed. In particular, the motor 414 once activated will cause the screw jack 406 to rotate which in turn causes the mounting sleeves 410 to elevate or lower, depending on the direction of rotation, which in turn raises or lowers the magnet 402. In this way, various anatomical areas of interest of the patient 436 may be scanned, including the torso, head or ankles of the patient.

Figure 5:
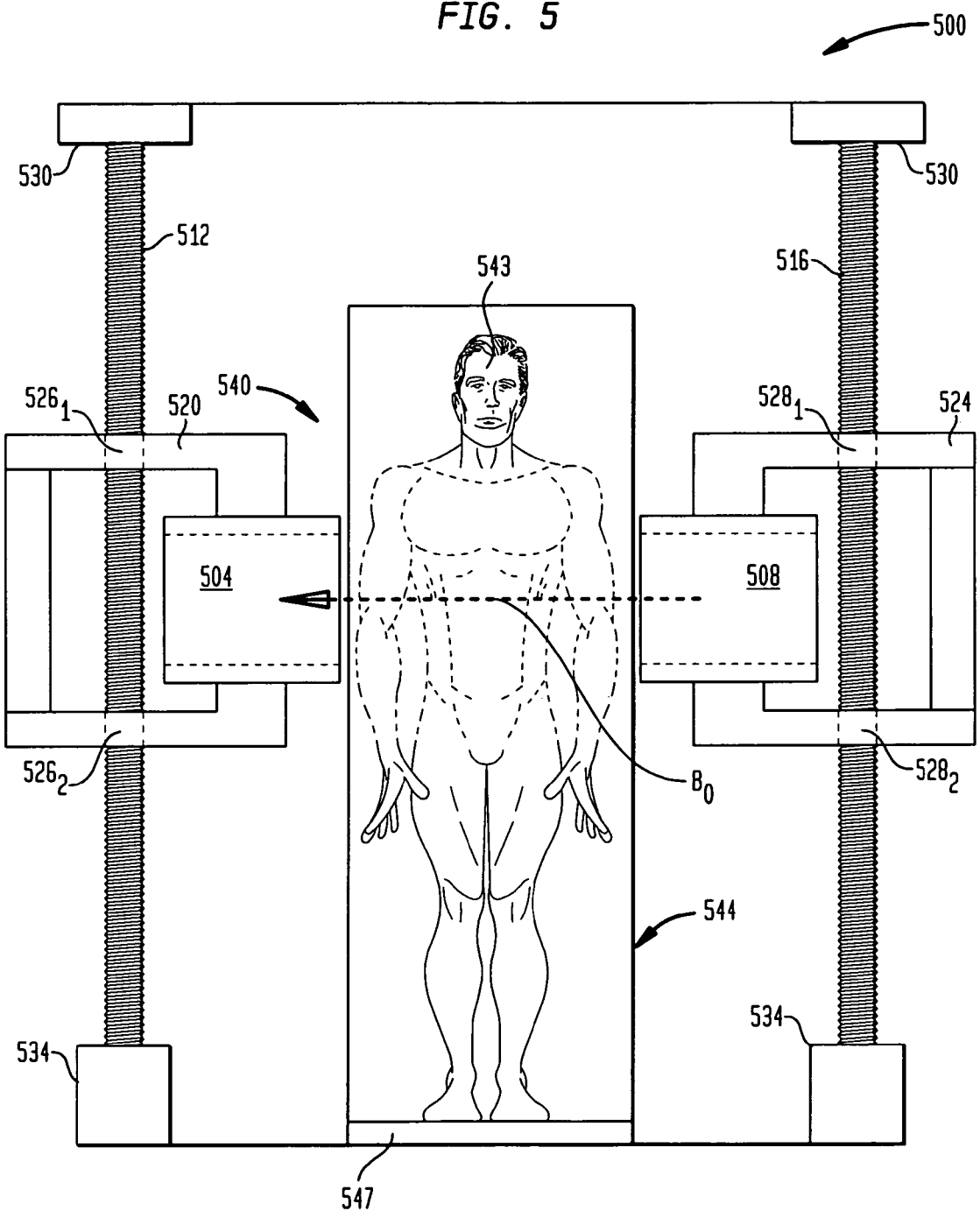
FIG. 5 illustrates a schematic front view of an apparatus embodying an aspect of the present invention.

FIG. 5 illustrates a schematic front view of a magnetic resonance imaging apparatus 500 in accordance with an additional aspect of the present invention. The apparatus 500 includes a first superconducting solenoidal magnet coil 504 and a second superconducting solenoidal magnet coil 508 which are arranged to produce a horizontal magnetic field $B_0$ as shown. Each coil 504, 508 is connected to screw jacks 512, 516 by respective C-shaped brackets 520, 524. Each of the C-shaped brackets 520, 524 are appropriately bored 526, 528 to receive their respective screw jacks 512, 516. Support members 530 are connected at one end of each of the screw jacks 512, 516. Motors 534 are connected to the other end of the screw jacks 512, 516 as shown.

As shown, the solenoidal magnet coils 504, 508 are arranged to provide a static magnetic field $B_0$ in a substantially horizontal direction across a gap 540 for receiving a patient 543.

Figure 6:
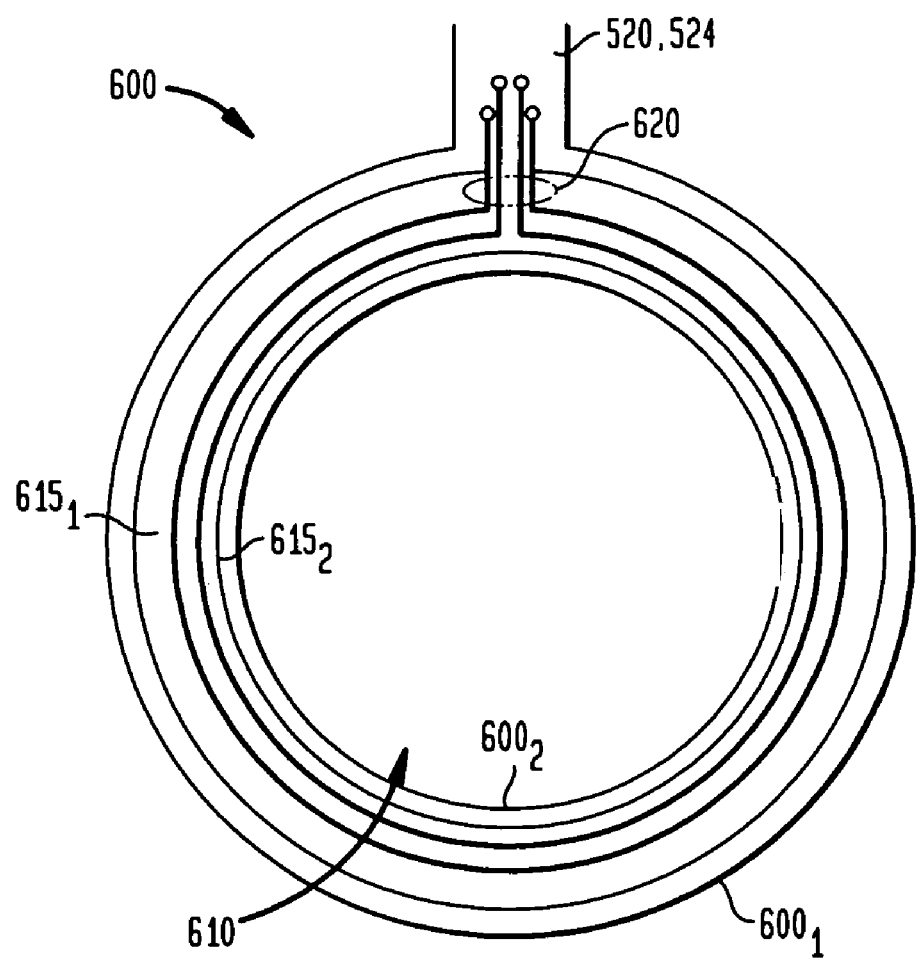
FIG. 6 illustratively depicts a superconducting magnet coil in accordance with an aspect of the present invention.

The superconducting solenoidal magnet coils 504, 508 may be housed in a cylindrical vessel 600 having a bore 610 as is shown in FIG. 6. Preferably, the cylindrical vessel 600 includes a cryostat or cryogenic containment vessel 615, which houses the coils of superconductive wires that provide a high-strength, substantially homogeneous magnetic field $B_0$ necessary for imaging. As can be seen in FIG. 6, the cylindrical vessel 600 includes an outer cylindrical wall $600_1$ and an inner cylindrical wall $600_2$. The containment vessel 615 includes an outer cylindrical wall $615_1$ and an inner cylindrical all $615_2$. Two sample coils 620 are depicted as being housed in the containment vessel 615. A cryostat is arranged in a known manner to surround the coils 620 to allow the coils or wires to function as superconductors. Accordingly, the cryostat preferably contains liquid helium for maintaining the wires below their critical temperature. As the coils are energized in a known manner, a static magnetic field $B_0$ is produced as shown in FIG. 5. As one skilled in the art may know, the magnet coils are not limited to the construction described herein. Other magnet coils may be used in accordance with this aspect of the present invention.

The motors 534, as shown in FIG. 5, may comprise electrical, electromechanical, pneumatic, hydraulic or other devices capable of imparting the desired motion to the screw jacks 512, 516. In particular, the motors 534 cause the screw jacks 512, 516 to rotate clockwise or counter clockwise to lower or raise the magnet coils 504, 508 so that the patient's anatomical region of interest may be scanned. The motor 534 itself may further include controls, not shown, that an operator may use to lower or raise the patient as desired.

A patient support 544 may be preferably positioned within the gap 540 and used for positioning a patient for imaging. The patient support 544 may include a footrest 547 on which the patient 543 may stand. Alternatively, a patient may stand within the gap 540 without the aid of the patient support 544 while imaging is conducted. By having a patient support, such as patient support 544, straps and other devices may be employed to assist the patient in remaining still while imaging takes place.

In operation, a patient, such as the patient 543, is positioned on the patient support 544. The energized magnet coils 504, 508 are then suitably lowered or raised, preferably simultaneously, by activation of the motors 534. In particular, the motors 534 cause the screw jacks 512, 516 to rotate, which in turn causes the C-shaped brackets 520, 524 to elevate or lower, depending on the direction of rotation, which in turn raises or lowers the superconducting magnet coils 504, 508. In this way, various anatomical areas of interest of the patient 543 may be scanned, including, for example, the patient's head, torso, ankles or feet.

Figure 7:
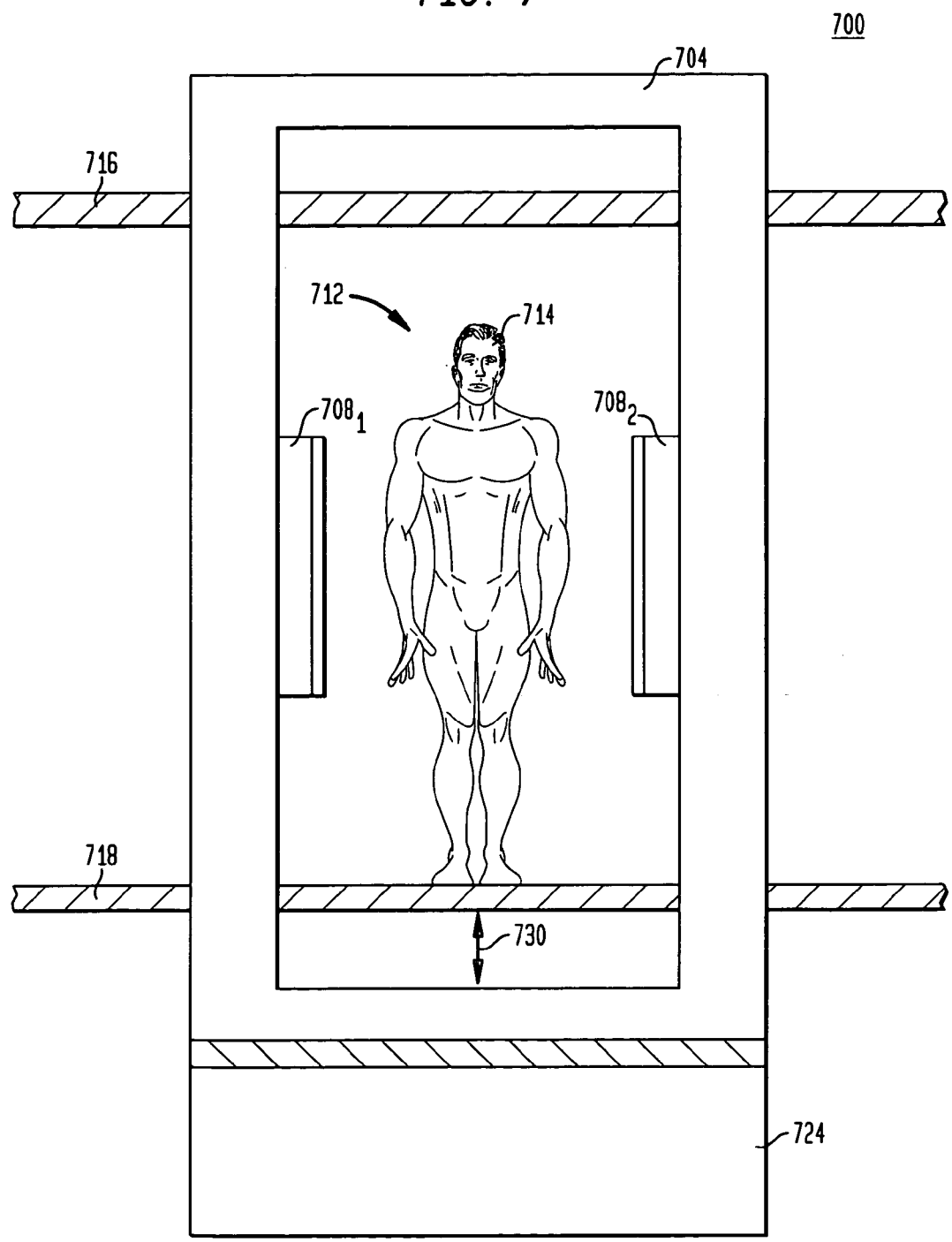
FIG. 7 illustrates a schematic front view of an apparatus in accordance with an aspect of the present invention.

FIG. 7 illustrates a schematic front view of an apparatus in accordance with an additional aspect of the present invention. The apparatus 700 includes a frame 704 and a pair of poles 708 which define a patient receiving space 712 for receiving a patient 714. The frame 704 and poles 708 define a magnetic resonance imaging scanner magnet such as that disclosed in commonly assigned U.S. Pat. No. 6,677,753, the disclosure of which is hereby incorporated herein by reference herein. In accordance with this aspect of the present invention, the frame 704 of the magnet is integrated into the room or structure housing the magnet. In particular, the vertical runs of the frame 704 are mounted through openings in the ceiling 716 and floor 718 of a room. In order to limit the fringe field from extending into other rooms or areas of the building, shielding (not shown) may be provided to further limit the area and strength of the fringe field. In accordance with this aspect of the present invention an elevator 724 or other means may be mounted beneath the floor 718 so as to raise or lower the magnet in the direction 730 shown. The elevator 724 may comprise electric, electromechanical or pneumatic devices capable of imparting the desired motion in a substantially vertical direction to the frame 704 and, in turn, to the poles 708 so as to vertically translate the imaging volume. As such, a patient 714 may stand, sit (not shown), or lie on a patient receiving apparatus (not shown) and be imaged. If a patient is oriented in the standing or sitting position, the elevator 724 may then be operated so as to enable various portions of the patient's 714 anatomy to be imaged by moving the frame 704 and poles 708 in a substantially vertical direction.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for magnetic resonance imagining, comprising:
   first and second superconducting solenoidal coils arranged to provide a static horizontal magnetic field for magnetic resonance imaging;
   first and second support members respectively coupled to said first and second superconducting coils; and
   one or more motors coupled to either of said first or second support member, said at least one motor translating said first and second superconducting solenoidal coils in a substantially vertical direction.

2. The apparatus of claim 1, wherein said first and second support members comprise first and second structures oriented so as to maintain translation of said first and second superconducting coils in the substantially vertical direction.

3. The apparatus of claim 2, wherein said first and second support structures comprise first and second vertical support members and respective support brackets.

4. The apparatus of claim 1, wherein said first and second support members each comprise screw jacks which are each respectively coupled to a first motor and a second motor from among said one or more motors.

5. The apparatus of claim 1, wherein said one or more motors comprises at least one electric motor.

6. The apparatus of claim 1, wherein said one or more motors comprise electromechanical devices capable of imparting a desired motion to said first and second superconducting coils.

7. The apparatus of claim 1, wherein said one or more motors comprise pneumatic devices capable of imparting a desired motion to said first and second superconducting coils.

8. The apparatus of claim 7, wherein said first and second vertical support members each comprise screw jacks which are each coupled to a first motor and a second motor from among said one or more motors.

9. The apparatus of claim 8, wherein said one or more motors comprises at least one electric motor.

10. The apparatus of claim 8, wherein said one or more motors comprise electromechanical devices capable of imparting the desired motion to said first and second superconducting coils.

11. The apparatus of claim 8, wherein said one or more motors comprise pneumatic devices capable of impacting the desired motion to said first and second superconducting coils.

12. The apparatus of claim 1, wherein said first and second vertical support members are respectively connected to said first and second superconducting solenoidal coils by respective first and second C-shaped brackets.

13. A magnetic resonance imaging system, comprising:
   a magnet having a frame and a pair of poles that define a patient receiving space;
   a structure having a top and a bottom for housing said magnet such that said magnet is integrated into said structure; and
   an elevator mounted beneath the bottom of said structure and operable to translate said magnet in a substantially vertical direction.

14. The system of claim 13, wherein said structure comprises a room and the top comprises a ceiling and the bottom comprises a floor of said room.

15. The system of claim 14, wherein the ceiling and floor each include openings through which vertical runs of the frame of said magnet are passed through so as to allow vertical translation.

16. The system of claim 14, wherein said room is shielded to limit the area of a fringe field produced by said magnet.

17. The system of claim 13, wherein said elevator comprises one of more pneumatic devices arranged so as to impart a desired motion.

18. The system of claim 13, further comprising a patient support positioned within the patient receiving space, the patient support being capable of supporting a patient in a substantially upright position.

19. The system of claim 18, further comprising a patient support positioned within the patient receiving space, the patient support being capable of supporting a patient in a standing position.

20. The system of claim 18, further comprising a patient support positioned within the patient receiving space, the patient support being capable of supporting a patient in a sitting position.

21. The system of claim 18, further comprising a patient support positioned within the patient receiving space, the patient support being capable of supporting a patient in a recumbent position.

* * * * *